(12) United States Patent
O'Donoghue (10) Patent No.: US 9,960,785 B1
(45) Date of Patent: May 1, 2018

(54) DUAL-INPUT ANALOG-TO-DIGITAL CONVERTER FOR IMPROVED RECEIVER GAIN CONTROL

(71) Applicant: Analog Devices Global, Hamilton (BM)

(72) Inventor: Keith Anthony O'Donoghue, Cork (IE)

(73) Assignee: Analog Devices Global, Hamilton (BM)

( * ) Notice: Subject to any disclaimer, the term of this patent is extended or adjusted under 35 U.S.C. 154(b) by 0 days. days.

(21) Appl. No.: 15/480,905

(22) Filed: Apr. 6, 2017

(51) Int. Cl.
*H03M 3/00* (2006.01)

(52) U.S. Cl.
CPC ........... *H03M 3/422* (2013.01); *H03M 3/464* (2013.01)

(58) Field of Classification Search
CPC ..... H04W 52/52; H04W 52/32; H04W 52/08; H03G 3/3068; H03G 3/3052; H03G 3/3078; H03G 3/001; H03G 3/20; H03M 3/30
USPC ........... 341/143, 118, 120; 375/345; 455/69, 455/552
See application file for complete search history.

(56) References Cited

U.S. PATENT DOCUMENTS

| | | | |
|---|---|---|---|
| 6,160,859 A * | 12/2000 | Martin | H04B 1/005 341/143 |
| 6,965,655 B1 | 11/2005 | Mostov et al. | |
| 7,215,269 B2 * | 5/2007 | Lee | H03M 3/462 341/143 |
| 7,471,229 B2 | 12/2008 | Schofield et al. | |
| 7,557,741 B2 * | 7/2009 | Van Veldhoven | H03M 3/362 341/139 |
| 7,852,249 B2 | 12/2010 | Ollaei | |
| 9,035,813 B2 | 5/2015 | Miglani | |
| 9,160,356 B1 | 10/2015 | Kearney et al. | |
| 2006/0164272 A1 * | 7/2006 | Philips | H03M 3/344 341/143 |
| 2006/0220935 A1 * | 10/2006 | Hughes | H03M 1/181 341/143 |
| 2007/0035429 A1 * | 2/2007 | Schreier | H03M 3/376 341/143 |
| 2007/0086547 A1 * | 4/2007 | Sobchak | H04L 27/3809 375/345 |
| 2008/0068240 A1 * | 3/2008 | Matsuura | H03M 3/51 341/143 |
| 2008/0218392 A1 * | 9/2008 | Van Veldhoven | H03M 3/462 341/143 |
| 2008/0309535 A1 * | 12/2008 | Le Guillou | H03M 3/30 341/143 |

(Continued)

OTHER PUBLICATIONS

"High Performance, Low Power, 169 MHz ISM Band, Radio Transceiver IC", Analog Devices, Datasheet ADF7030, (2015), 25 pgs.

(Continued)

*Primary Examiner* — Linh Nguyen
(74) *Attorney, Agent, or Firm* — Schwegman Lundberg & Woessner, P.A.

(57) ABSTRACT

A latency associated with a receiver circuit, e.g., radio receiver circuit, can be reduced by applying digital data from an analog signal received by a receiver, e.g., a radio receiver, to an automatic gain control circuit without first using a decimation and digital filtering process, which can minimize or eliminate significant latency associated with the decimation and filtering process.

23 Claims, 7 Drawing Sheets

(56) References Cited

U.S. PATENT DOCUMENTS

| | | | | |
|---|---|---|---|---|
| 2011/0200077 | A1* | 8/2011 | Mitani | H03M 3/388 375/219 |
| 2012/0133537 | A1* | 5/2012 | Lee | H03M 3/492 341/143 |
| 2012/0326904 | A1* | 12/2012 | Jensen | H03M 3/396 341/131 |
| 2014/0336948 | A1* | 11/2014 | Qin | A61B 5/7217 702/19 |
| 2015/0381198 | A1* | 12/2015 | Lasseuguette | G01R 19/2509 341/143 |

OTHER PUBLICATIONS

Bandyopadhyay, Abhishek, et al., "A 97.3 dB SNR, 600 kHz BW, 31mW Multibit Continuous Time ?S ADC", IEEE Symposium on VSLI Circuits Digest of Technical Papers, 978-1-4799-3328-0/14, (2014), 2 pgs.

Cherry, James A, et al., "Excess Loop Delay in Continuous-Time Delta-Sigma Modulators", IEEE Transactions on Circuits and Systems II: Analog and Digital Signal Processing vol. 46, No. 4, (Apr. 1999), 376-389.

Kappes, Michael S., "A 2.2-mW CMOS Bandpass Continuous-Time Multibit ?-S ADC With 68 dB of Dynamic Range and 1-MHz Bandwith for Wireless Applications", IEEE Journal of Solid-State Circuits vol. 38, No. 7, (Jul. 2003), 1098-1104.

Kearney, Niall, et al., "A 160-to-960MHz ETSI Class-1-Compliant IoE Transceiver with 100dB Blocker Rejection, 70 dB ACR and 800pA Standby Current", ISSCC Session 26 Wireless for IoE 26.4, (2016), 442-444.

Loeda, Sebastian, et al., "A 10/20/30/40 MHz Feedforward FIR DAC Continuous-Time ?S ADC With Robust Blocker Performance for Radio Receivers", IEEE Journal of Solid-State Circuits vol. 50, No. 4, (Apr. 2016), 860-870.

Mitteregger, Gerhard, et al., "A 20-mW 640-MHz CMOS Continuous-Time ?S ADC With 20-MHz Signal Bandwidth, 80-dB Dynamic Range and 12-bit ENOB", IEEE Journal of Solid-State Circuitrs vol. 41, No. 12, (Dec. 2006), 2641-2649.

Pavan, Shanthi, "Systematic Design Centering of Continuous Time Oversampling Converters", IEEE Transactions on Circuits and Systems II: Express Briefs, vol. 57, No. 3, (Mar. 2010), 158-162.

Saxena, Vishal, "Delta-Sigma Analog-to-Digital Converts: From System Architecture to Transistor-Level Design", IEEE MWSCAS, Boise State University Department of Electrical and Computer Engineering, (Aug. 5 ,2012), 77 pgs.

Schinkel, Daniel, et al., "A Double-Tail Latch-Type Voltage Sense Amplifier with 18ps Setup+Hold Time", ISSCC 2007 Session 17 Analog Techniques and PLLs 17.7, (2007), 314-315, 605.

Shettigar, Pradeep, et al., "Design Techniques for Wideband Single-Bit Continuous-Time ?S Modulators With FIR Feedback DACs", IEEE Journal of Solid-State Circuits, vol. 47, No. 12, (Dec. 2012), 2865-2879.

Shu, Yun-Shiang, et al., "A 6b 3GS/s 11mW Fully Dynamic Flash ADC in 40nm CMOS with Reduced Number of Comparators", IEEE Symposium on VLSI Circuits Digest of Technical Papers, IEEE 978-1-4673-0849-6/12, (2012), 26-27.

Yan, Shouli, "A Continuous-Time ?S Modulator Witt 88-dB Dynamic Range and 1.1-MHz Signal Bandwith", IEEE Journal of Solid-State Circuits vol. 39 No. 1, (Jan. 2004), 75-86.

Yoon, Do-Yoon, et al., "A Continuous-Time Sturdy-MASH ?S Modulator in 28 nm CMOS", IEEE Journal of Solid State Circuits vol. 50, No. 12, (Dec. 2015), 2880-2890.

"U.S. Appl. No. 15/480,905, Preliminary Amendment Filed Apr. 7, 2017", 3 pgs.

* cited by examiner

DUAL-INPUT ANALOG-TO-DIGITAL CONVERTER FOR IMPROVED RECEIVER GAIN CONTROL

FIELD OF THE DISCLOSURE

The present disclosure relates to communication networks.

BACKGROUND

Integrated radiofrequency (RF) transceivers that can operate at low power dissipation are becoming increasingly important in a variety of communication networks, e.g., point-to-point packet based wireless communication networks. For example, in Internet-of-Things ("IoT") systems such as Wireless Metering, Home Automation, Wireless Alarms and Sensor Networks, achieving both high performance and low-power operation in reduced silicon area can be important.

SUMMARY OF THE DISCLOSURE

Using various techniques of this disclosure, a latency associated with a receiver circuit, e.g., radio receiver circuit, can be reduced. More particularly, using various techniques of this disclosure, digital data from an analog signal received by a receiver, e.g., a radio receiver, can be applied to an Automatic Gain Control (AGC) circuit without first using a decimation and digital filtering process, which can minimize or eliminate significant latency associated with the decimation and filtering process.

In some aspects, this disclosure is directed to an analog-to-digital converter (ADC) circuit comprising a loop filter circuit including a first input configured to receive a difference between a first representation of an input signal and a second input configured to receive a feedback signal; a quantizer circuit including: at least one input configured to receive an output of the loop filter circuit and configured to receive a second representation of the input signal that bypasses the loop filter circuit; an AGC control output, coupled to an input of an automatic gain control (AGC) circuit to establish a gain parameter using a quantization of the second representation of the input signal that bypasses the loop filter circuit; and a quantizer signal output, coupled to an input of a decimation circuit to provide a quantized signal using a quantization of a difference between the first representation of an input signal and the feedback signal. The ADC circuit further comprises a digital to analog converter (DAC) circuit configured to receive the quantizer signal output and provide the feedback signal to the second input of the loop filter circuit.

In some aspects, this disclosure is directed to a radiofrequency (RF) receiver circuit comprising an antenna to receive an RF input signal; a low noise amplifier (LNA) circuit including an input coupled to the antenna and an output; a mixer circuit including a first input configured to receive the output of the LNA circuit, a second input configured to receive a local oscillator signal, and an output, the mixer circuit configured to mix the output of the LNA circuit received at the first input with the local oscillator signal received at the second input to provide an intermediate frequency signal at a lower frequency than the received RF signal at the output; a baseband filter circuit including an input configured to receive the output of the mixer circuit; and an automatic gain control (AGC) circuit including an input and at least one output coupled to and configured to establish a gain parameter of at least one of the LNA circuit, the mixer circuit, and the baseband filter circuit. The RF receiver circuit further comprises an analog-to-digital converter (ADC) circuit coupled to an output one of the baseband filter circuit and a programmable gain amplifier circuit, the ADC circuit including a loop filter circuit including a first input configured to receive a feedback signal and a second input configured to receive the output of one of the baseband filter circuit and the programmable gain amplifier circuit; a quantizer circuit including: at least one input configured to receive an output of the loop filter circuit and configured to receive a representation of the input signal that bypasses the loop filter circuit; an AGC control output, coupled to the input of the automatic gain control (AGC) circuit; and a quantizer signal output, coupled to an input of a decimation circuit to provide a quantized signal using a quantization of a difference between the representation of the RF input signal and the feedback signal. The ADC circuit further comprises a digital to analog converter (DAC) circuit configured to receive the quantizer signal output and provide the feedback signal to the first input of the loop filter circuit; and a demodulator circuit configured to demodulate an output of the decimation circuit.

In some aspects, this disclosure is directed to a method for radio receiver gain control, the method comprising: receiving a radiofrequency (RF) signal; generating a first representation of the RF signal; applying the first representation of the RF signal to a first input of a loop filter circuit an analog-to-digital circuit (ADC); applying an output of the loop filter circuit to at least one input of a quantizer circuit of the ADC, generating a first quantized digital output, and applying the first quantized digital output to a decimation and digital filter circuit; applying a second representation of the RF signal to the at least one input of the quantizer circuit of the ADC and generating a second quantized digital output; and applying the second quantized digital output to an automatic gain control circuit.

This overview is intended to provide an overview of subject matter of the present patent application. It is not intended to provide an exclusive or exhaustive explanation of the invention. The detailed description is included to provide further information about the present patent application.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

In some implementations, a design of an RF receiver circuit, e.g., in an integrated transceiver, can be dominated by a trade-off between high performance, low power and silicon area. To conserve power, it can be desirable for a receiver circuit, e.g., a radio receiver circuit, to power up only when the circuit receives an indication that a signal is present. Upon receipt, an automatic gain control (AGC) circuit should quickly set gain levels of various circuits along the signal chain, receive the signal, and then shut down. The AGC circuit attempts to keep circuits along the signal chain from saturating, e.g., from a large power signal at the antenna, and keep an input signal level within a dynamic range of an analog to digital converter. If there is latency, the signal could saturate the components, for example, before the gain levels are set, and the signal would need to be re-transmitted, thus wasting power.

Using various techniques of this disclosure, a latency associated with a receiver circuit, e.g., radio receiver circuit, can be reduced. More particularly, using various techniques of this disclosure, digital data from an analog signal received by a receiver, e.g., a radio receiver, can be applied to an Automatic Gain Control (AGC) circuit without first using a decimation and digital filtering process, which can minimize or eliminate significant latency associated with the decimation and filtering process.

Figure 1:
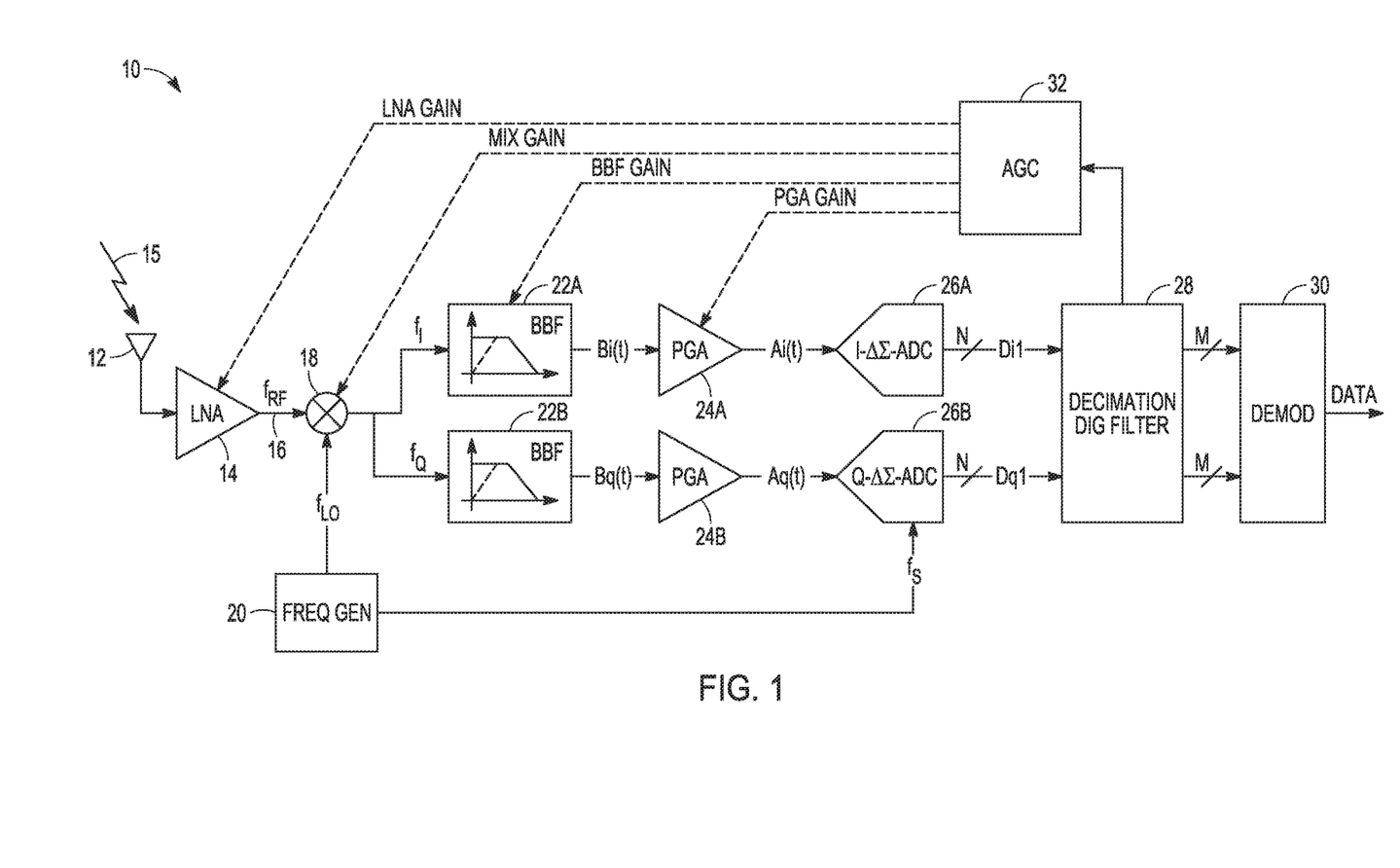
FIG. 1 depicts a block diagram of an example approach to a receiver architecture in an integrated transceiver implementation.

FIG. 1 depicts a block diagram of an example approach to a receiver architecture in an integrated transceiver implementation. The receiver circuit 10 can include an RF antenna 12 that can be coupled to a low noise amplifier 14 (LNA) at the input to the receiver with the LNA output 16 coupled to an I/Q mixing circuit 18 that downconverts the incoming RF signal $f_{RF}$ to in-phase (I)-channel and quadrature-phase (Q)-channel baseband signals $f_I$ and $f_Q$. An on-chip frequency generator (FREQGEN) circuit 20 can provide a signal $f_{LO}$ for the mixing operation and can be used to target the desired receiver channel.

Analog baseband filter (BBF) circuits 22A, 22B can provide filtering and, in some cases, gain and/or attenuation of the downconverted signals fI and fQ. In this implementation, the BBF circuits 22A, 22B can optionally be followed by respective Programmable Gain Amplifier (PGA) circuits 24A, 24B that can drive respective oversampling Sigma-Delta (ΔΣ) Analog-to-Digital Converter (ADC) circuits 26A, 26B. The ADC circuits 26A, 26B can digitize the outputs Ai(t) and Aq(t) of the PGA circuits 24A, 24B (if present) into N-bit oversampled digital signals Di1 and Dq1, respectively. The oversampled N-bit outputs can be down-sampled and digitally filtered by a decimation and digital filter circuit 28 yielding high-accuracy M-bit signals (M>N) for demodulation in the digital baseband by demodulator circuit 30.

In the receiver signal chain of FIG. 1, an automatic gain controller (AGC) circuit 32 can adjust the gain of various components in the analog receiver, e.g., one or more of the LNA circuit 14, the mixer circuit 18, the BBF circuits 22A, 22B, and the PGA circuits 24A, 24B. The AGC 32 can be important to the robustness and reliability of the overall radio receiver as it can allow for an increase in the dynamic range of the receiver and can improve performance in the presence of strong interferer signals.

In the example shown in FIG. 1, the AGC circuit 32 can adjust the gain of one or more of the LNA circuit 14, the mixer circuit 18, the BBF circuits 22A, 22B, and the PGA circuits 24A, 24B in response to varying power levels at the input of the ADC circuits 26A, 26B to ensure that the signal power at Ai(t) and Aq(t) is within a specified range. Due to the inherent nature of ΔΣ-ADCs, outputs Di1 and Dq1, oversampled at a frequency fs, can contain large amounts of shaped quantization noise outside the desired channel bandwidth fb. As a result, it can be desirable to remove this quantization noise by digitally filtering and decimating the digital outputs Di1 and Dq1 before they can be utilized for AGC and demodulation. The output of the decimation and digital filter circuit 28 can be applied to demodulation circuit 30.

Digital filtering and decimation of the ΔΣ-ADC output in the receiver signal chain can add significant constraints to the design of the AGC circuit 32 and can be detrimental to the overall performance of a radio receiver, particularly in point-to-point packet based protocols. In such protocols, which are popular in IoT based applications, fast and reliable AGC during preamble can be necessary to increase throughput efficiency, improve link reliability, reduce network instability and ultimately save overall power consumption.

Recently, in power-constrained integrated RF receivers for next-generation wireless and IoT applications, the continuous-time (CT) ΔΣ-ADC has gained in popularity due to inherent anti-aliasing, relaxed internal operational amplifier (opamp) bandwidth requirements and a resistive input that can be easy to drive relative to discrete-time (DT) implementations. Delta-Sigma (ΔΣ) Analog-to-Digital Converters (ADCs) are a class of data converter that can utilize over-sampling and noise shaping to achieve extremely high signal-to-noise (SNR) performance in a given bandwidth.

Figure 2:
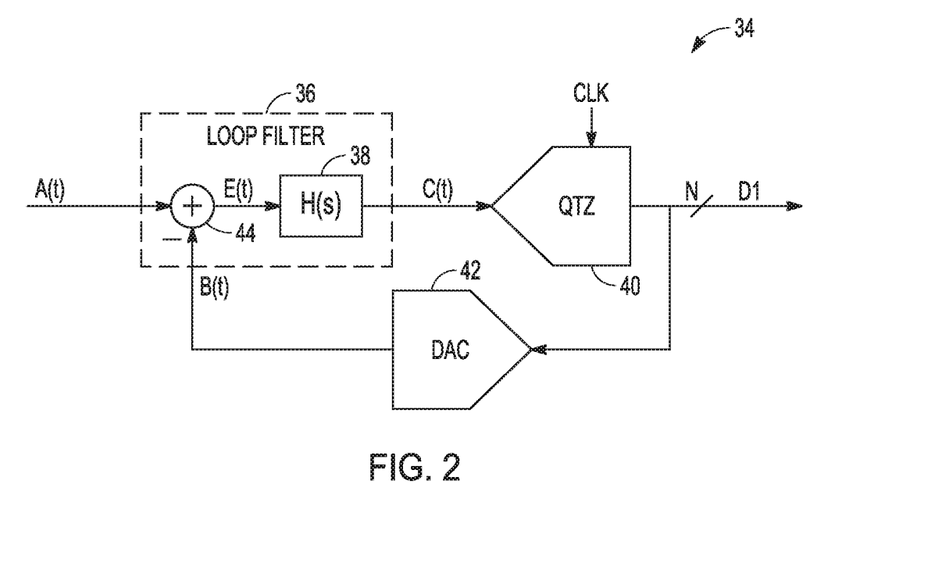
FIG. 2 depicts a block diagram of an example approach to an analog-to-digital converter.

FIG. 2 depicts a block diagram of an example approach to an ADC. In some examples, the ADC 34 of FIG. 2, e.g., ADC 26A or ADC 26B of FIG. 1, can be a continuous-time ΔΣ-ADC. The ADC 34 of FIG. 2, shown receiving an analog input signal A(t), e.g., signals Ai(t) or Aq(t) in FIG. 1, can include a continuous-time loop filter circuit 36. The loop filter circuit 36 can include at least one integrator or resonator circuit and can be described as a combination of transfer functions that result in a transfer function H(s) 38. The ADC 34 of FIG. 2 can include an N-bit quantizer (QTZ) circuit 40, e.g., where 1≤N≤5, configured to receive an output C(t) of the loop filter circuit 36. In some examples, the N-bit quantizer circuit 40 can be implemented as a FLASH ADC due to the low number of bits required. The quantizer circuit 40 can generate a digital output D1 sampled by a clock signal at frequency fs.

The ADC 34 of FIG. 2 can include a digital-to-analog converter (DAC) circuit 42 connected to an output of the quantizer circuit 40 and connected in feedback to an input of the loop filter circuit 36. In some examples, the output B(t) of the DAC circuit 42 can be subtracted from the analog input signal A(t) to generate the loop filter input E(t), as conceptually depicted by a subtractor circuit 44.

Excess Loop Delay (ELD) is an issue that can affect the stability of a CT ΔΣ-ADC, such as the one shown in FIG. 2. Excess Loop Delay refers to the delay between the sampling of signal C(t) at the internal quantizer input of the quantizer circuit 40 and the generation of the corresponding feedback pulse B(t) at the output of the DAC circuit 42. Various techniques can mitigate the effects of ELD and a total delay of up to a full sampling clock period Ts=(1/fs) can generally be tolerated in the ΔΣ-ADC design. In a typical multibit (N>1) ΔΣ-ADC design, the internal quantizer is often required to deliver a latched output 131 to the DAC input in less than half a clock cycle to meet overall ELD requirements.

Figure 3:
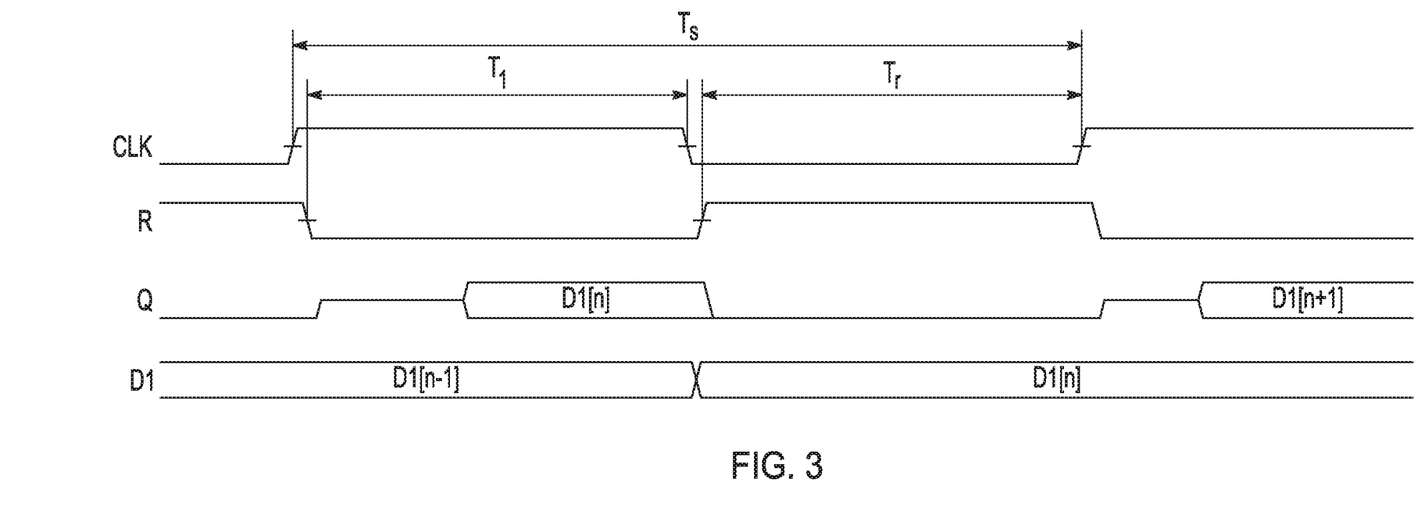
FIG. 3 depicts an example timing diagram for an N-bit FLASH based quantizer with input clock signal CLK sampled at frequency fs=1/Ts.

FIG. 3 depicts an example timing diagram for an N-bit FLASH based quantizer with input clock signal CLK sampled at frequency fs=1/Ts. After the rising edge of the CLK signal, a comparator latch reset signal R is released. During time T1, the active regeneration phase, each comparator latch in the quantizer circuit 40 of FIG. 2 can attempt to make a 1 or 0 decision based on the input voltage level at the latch input C(t) relative to a reference voltage level. The quantizer decision signal Q can be clocked into a memory element, such as a D-type flip-flop (DFF), on the falling edge of the CLK signal to generate the stable output D1 that can drive the feedback DAC circuit 42 input.

After the falling edge of the CLK signal, the quantizer circuit 40 of FIG. 2 can return the comparator latch to a reset state denoted by time Tr, which can mitigate memory effects, setup various internal nodes, and initiate sampling of the input signal C(t) for the next regenerative phase beginning on the next rising edge of the CLK signal. In this way, a half cycle delay of Ts/2 from the beginning of the active phase at the rising edge of the CLK signal to the corresponding quantizer output D1 can be realized. In this example, the latch spends almost 50% of the sampling clock in the reset state Tr.

As described in detail below, using various techniques of this disclosure, a latency associated with a receiver circuit can be reduced. More particularly, a digital representation of a received analog signal can be applied to an Automatic Gain Control (AGC) circuit without first using a decimation and digital filtering process, which can minimize or eliminate significant latency associated with the decimation and filtering process.

Figure 4:
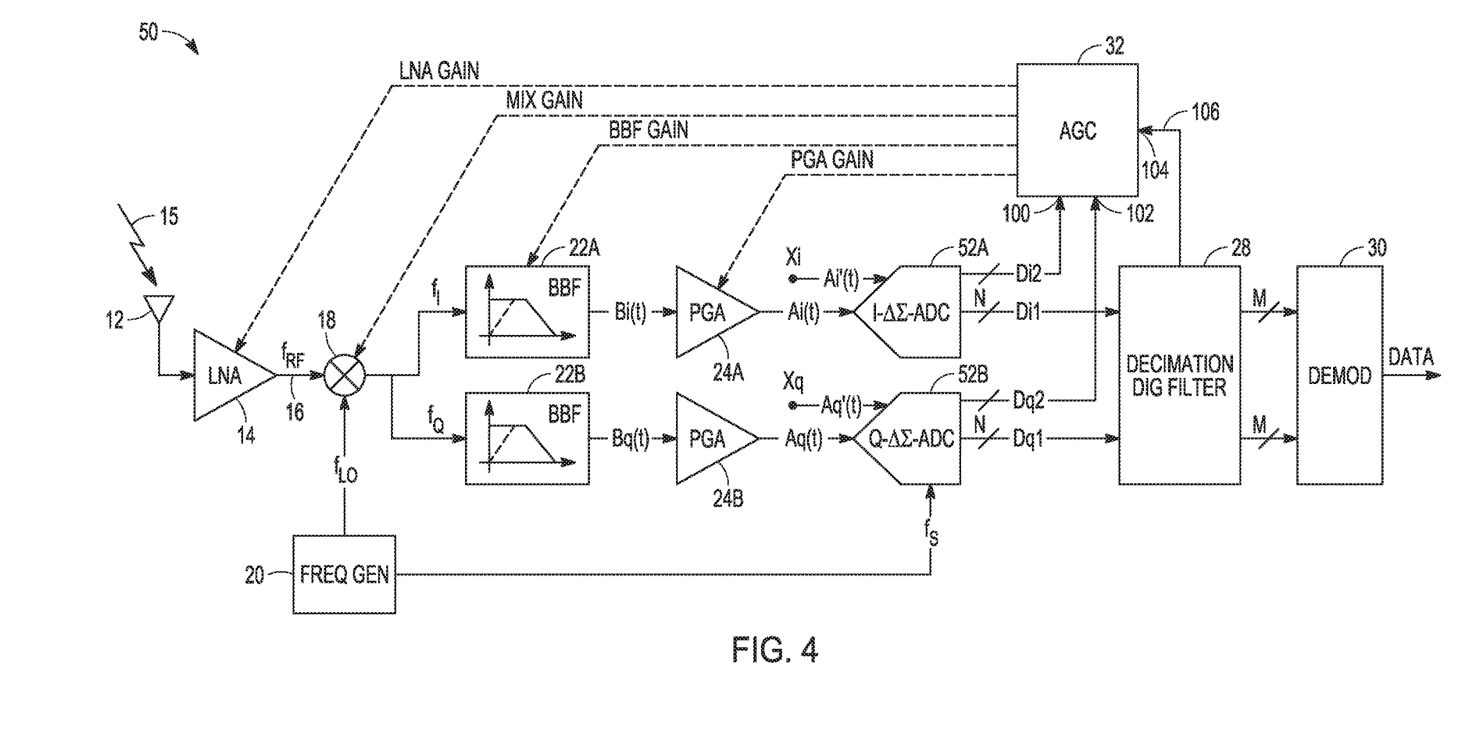
FIG. 4 depicts a block diagram of another example approach to a receiver architecture in an integrated transceiver implementation in accordance with this disclosure.

FIG. 4 depicts a block diagram of another example approach to a receiver architecture in an integrated transceiver implementation in accordance with this disclosure. The radiofrequency (RF) receiver circuit 50 of FIG. 4 is an alternative receiver architecture to that of FIG. 1, and can utilize dual-input ADCs. Many of the components of FIG. 4 are similar to those described above with respect to FIG. 1 and, for purposes of conciseness, will not be described again. The PGA circuits 24A, 24B are depicted in the receiver circuit but are optional. Like in FIG. 1, the ADCs 52A, 52B of FIG. 4 are coupled to the respective outputs Ai(t), Aq(t) of PGA circuits 24A, 24B with corresponding ADC outputs Di1 and Dq1 providing the oversampled N-bit I and Q channel outputs used for receiver demodulation by the demodulation circuit 30.

In example configurations that do not include the optional PGA circuits 24A, 24B, the ADCs 52A, 52B of FIG. 4 are coupled to the respective outputs Bi(t), Bq(t) of BBF circuits 22A, 22B with corresponding ADC outputs Di1 and Dq1 providing the oversampled N-bit I and Q channel outputs used for receiver demodulation by the demodulation circuit 30.

In accordance with this disclosure, an additional ADC input A'(t) can be used and coupled via nodes Xi and Xq to a variety of points along the quadrature receiver baseband such as the output (fI/fQ) of the mixer circuit 18, internal nodes of the BBF circuits 22A, 22B, the output (Bi(t)/Bq(t)) of the BBF circuits 22A, 22B, or the outputs (Ai(t)/Aq(t)) of the PGA circuits 24A, 24B. The additional input A'(t) can be sampled at a frequency fs to generate the outputs Di2, Dq2, e.g., N-bit Nyquist rate outputs, that can be used exclusively for the AGC circuit 32. As a result, in contrast to the circuit in FIG. 1, the digital data going to the AGC circuit 32 does not require decimation and digital filtering, thereby completely eliminating the significant latency associated with this operation. The outputs Di2 and Dq2, e.g., Nyquist rate N-bit outputs, sampled at frequency fs, can thus be used to quickly adjust the receiver gains e.g., of one or more of the LNA circuit 14, the mixer circuit 18, the BBF circuits 22A, 22B, and/or the PGA circuits 24A, 24B, as needed during preamble by providing the ability to monitor various points along the receiver baseband. In other words, rather than exclusively applying the slow, highly accurate signals outputs Di1 and Dq1 to the AGC circuit 32, as in FIG. 1, using the techniques of this disclosure, the Di2 and Dq2 signal outputs can be used to provide fast, course signals to the AGC circuit 32 to quickly set the gain levels of one or more components in the signal chain.

The architecture of the receiver circuit 50 of FIG. 4 can reduce complexity in the overall AGC circuit 32 by removing the need for digital decimation and filtering as well as increasing observability along the receiver analog baseband. These enhancements can improve reliability, stability and power consumption in point-to-point packet based radio protocols.

As seen in FIG. 4, the AGC circuit 32 can include multiple inputs, e.g., inputs 100, 102, and 104, to receive one or more of signals Di2, Dq2 from the ADCs 52A, 52B, and an output signal 106 from the decimation and digital filter circuit 28. The Di2 and Dq2 signal outputs can provide fast, course signals to the AGC circuit 32 to quickly set the gain levels of one or more components in the signal chain. In some examples, the AGC circuit 32 can also receive the slower, highly accurate signals outputs Di1 and Dq1.

Figure 5:
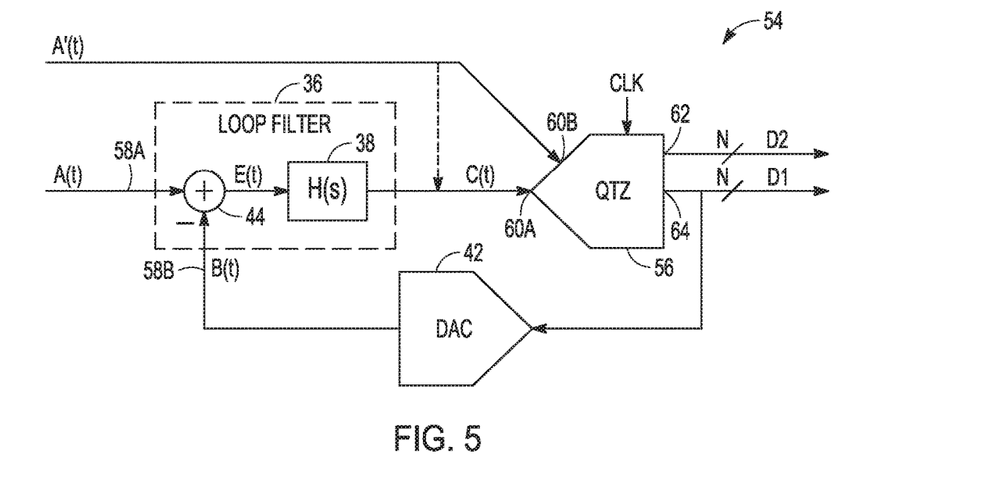
FIG. 5 depicts a block diagram of another example approach to an analog-to-digital converter in accordance with this disclosure.

FIG. 5 depicts a block diagram of another example approach to an ADC in accordance with this disclosure. The ADC 54 of FIG. 5 can be used to implement the ADCs 52A, 52B in respective I/Q channels of the receiver circuit of FIG. 4. For simplicity, the ADC 54 of FIG. 5 will be described generically with respect to the I/Q channels of FIG. 4, e.g., outputs D1/D2 instead of outputs Di1/Di2 or outputs Dq1/Dq2.

As indicated above, the PGA circuits 24A, 24B of FIG. 4 are optional. In configurations that include the PGA circuits 24A, 24B, their respective outputs Ai(t), Aq(t) can be applied to respective ADCs, such as the ADC 54 shown in FIG. 5 or the ADC 70 shown in FIG. 6.

Figure 6:
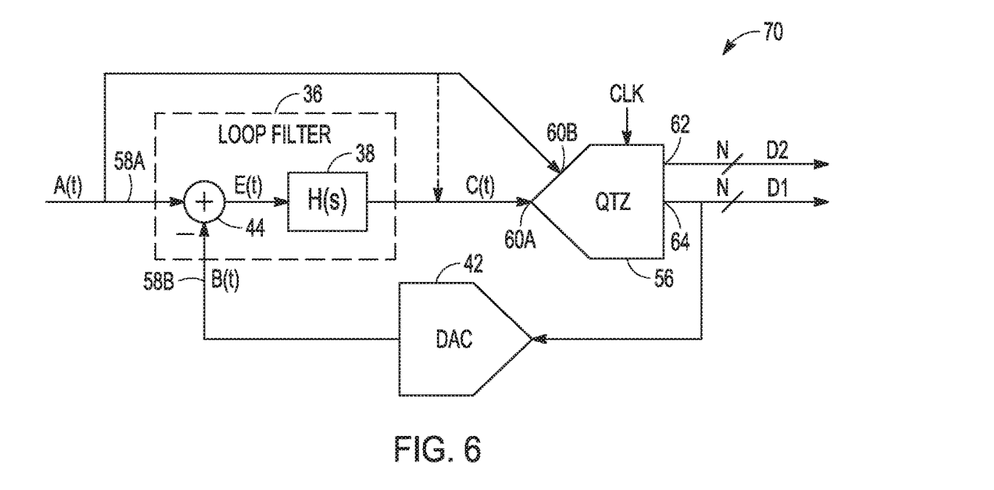
FIG. 6 depicts a block diagram of another example approach to an ADC in accordance with this disclosure.

In example configurations that do not include the optional PGA circuits 24A, 24B, the respective outputs Bi(t), Bq(t) of BBF circuits 22A, 22B of FIG. 4 can be applied to respective ADCs, such as the ADC 54 shown in FIG. 5 or the ADC 70 shown in FIG. 6, instead of the outputs Ai(t), Aq(t) of the PGA circuits 24A, 24B. It should be understood that the techniques of this disclosure work similarly regardless of whether the ADC 54 shown in FIG. 5 or the ADC 70 shown in FIG. 6 receive the outputs Ai(t), Aq(t) of the PGA circuits 24A, 24B or the outputs Bi(t), Bq(t) of BBF circuits 22A, 22B.

The ADC 54 of FIG. 5 can include continuous-time loop filter circuit 36 having inputs 58A, 58B. The loop filter circuit 36 can include at least one integrator or resonator circuit including operational amplifiers, resistors, inductors, switches, and capacitors and can be described as a combination of transfer functions that result in a transfer function H(s) 38. The ADC 54 of FIG. 5 can include an N-bit quantizer (QTZ) circuit 56, e.g., where 1≤N≤5, configured to receive an output C(t) of the loop filter circuit 36. In some examples, the N-bit quantizer circuit 56 can be implemented as a FLASH ADC, e.g., multi-bit FLASH ADC, due to the low number of bits required. The quantizer circuit 56 can generate a digital output D1 sampled by a clock signal at frequency fs.

The ADC 54 of FIG. 5 can include a digital-to-analog converter (DAC) circuit 42, e.g., current steering DAC, switched capacitor DAC, resistive DAC, connected to an output of the quantizer circuit 56 and connected in feedback to the input 58B of the loop filter circuit 36. In the example shown in FIG. 5, the loop filter circuit 36 can be implemented in a single feedback loop topology where the output B(t) of the DAC circuit 42 can be subtracted from the analog input signal A(t) to generate the signal E(t), as conceptually depicted by a subtractor circuit 44, which is an input to the transfer function H(s) 38. In this manner, the loop filter circuit 36 can include an input 58 configured to receive a difference between a first representation A(t) of an input signal 15 (received by the antenna 12 of FIG. 4) and a feedback signal B(t).

The quantizer circuit 56 can include one or more inputs 60A, 60B configured to receive an output C(t) of the loop filter circuit 36 and configured to receive a second representation A'(t) of the input signal 15 (received by the antenna 12 of FIG. 4) that bypasses the loop filter circuit 36. In some configurations, the quantizer circuit 56 can include two inputs 60A, 60B. For example, the input 60A of the quantizer circuit 56 can be configured to receive an output C(t) of the loop filter circuit 36 and the second input 60B can be configured to receive the second representation A'(t) of the input signal 15 (received by the antenna 12 of FIG. 4) that bypasses the loop filter circuit 36.

In other configurations, the quantizer circuit 56 can include one input, e.g., input 60A, that can receive both signals C(t) and A'(t) in a time-interleaved manner.

The quantizer circuit 56 can include two outputs, namely an AGC control output 62 and a quantizer signal output 64. The AGC control output 62, coupled to an input of an automatic gain control (AGC) circuit 32 (of FIG. 4), can output signal D2 directly to the AGC circuit 32 to establish a gain parameter using a quantization of the second representation A(t) of the input signal 15 (received by the antenna 12 of FIG. 4) that bypasses the loop filter circuit 36.

The quantizer signal output 64, coupled to an input of a decimation circuit 28 (of FIG. 4), can output signal D1 to provide a quantized signal using a quantization of the difference between a first representation A(t) of an input signal 15 (received by the antenna 12 of FIG. 4) and the feedback signal B(t) from the DAC circuit 42. The DAC circuit 42 can be configured to receive the quantizer signal output D1 and provide the feedback signal B(t) to the input 58B of the loop filter circuit 36.

Figure 7:
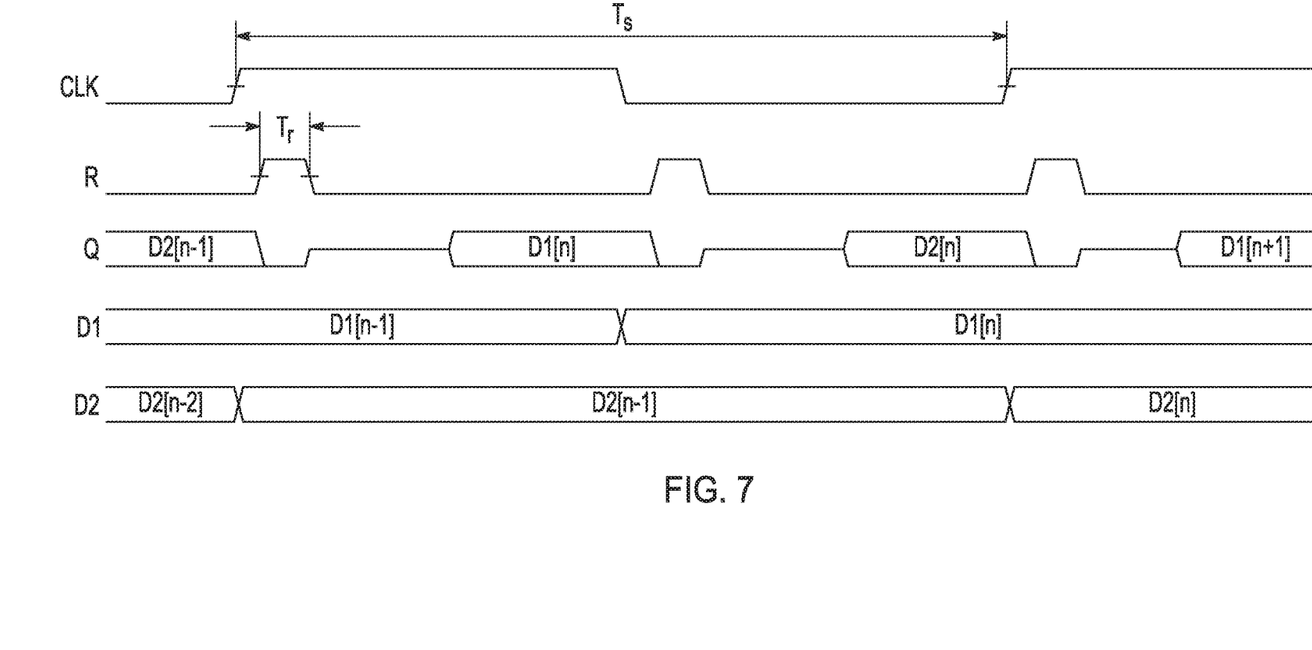
FIG. 7 depicts another example timing diagram for an N-bit FLASH based quantizer with input clock signal CLK sampled at frequency fs=1/Ts using various techniques of this disclosure described above with respect to FIGS. 4-6.

In the ADC architecture shown in FIG. 5, e.g., a CT ΔΣ-ADC, the additional input A'(t) can be converted directly by the N-bit quantizer circuit 56 to generate an N-bit output D2 during CLK_bar, as illustrated in the quantizer circuit timing diagram of FIG. 7.

As mentioned above with respect to FIG. 4, the additional ADC input A'(t) can be coupled via nodes Xi and Xq to a variety of points along the quadrature receiver baseband such as the output (fI/fQ) of the mixer circuit 18, internal nodes of the BBF circuits 22A, 22B, the outputs (Bi(t)/Bq(t)) of the BBF circuits 22A, 22B, or the outputs (Ai(t)/Aq(t)) of the PGA circuits 24A, 24B or any other signal the AGC circuit 32 may want to observe. For example, the input 58A of the loop filter circuit 36 can be configured to receive an output, e.g., signal Bi(t) of the baseband filter 22A, and an input of the quantizer circuit 56 can be coupled to one of the output of the BBF circuit 22A, an internal node (not depicted) of the BBF circuit filter 22A, and the output of the PGA circuit.

As another example, the input of the loop filter circuit 36 can be configured to receive an output, e.g., signal Bi(t) of the BBF circuit 22A or an output of the PGA circuit, and an input of the quantizer circuit 56 can be configured to receive an output of a mixer circuit, e.g., mixer circuit 18 of FIG. 4.

FIG. 6 depicts a block diagram of another example approach to an ADC in accordance with this disclosure. The ADC 70 of FIG. 6 can be used to implement the ADCs 52A, 52B in respective I/Q channels of the receiver circuit of FIG. 4. For simplicity, however, the ADC 70 of FIG. 6 will be described generically with respect to the I/Q channels of FIG. 4, e.g., outputs D1/D2 instead of outputs Di1/Di2 or outputs Dq1/Dq2.

In some examples, the ADC 70 of FIG. 6 can be a continuous-time ΔΣ-ADC. As seen in FIG. 6, the architecture of the dual input ADC can receive dual analog input signals and can generate corresponding outputs D1 and D2. In contrast to the example ADC 54 shown in FIG. 5 that received dual input signals A(t) and A'(t), the example ADC 70 shown in FIG. 6 can receive dual input signals where the additional input can be connected directly to the input A(t).

The ADC 70 of FIG. 6 can include continuous-time loop filter circuit 36 having inputs 58A, 58B. The loop filter circuit 36 can include at least one integrator or resonator circuit including operational amplifiers, resistors, inductors, switches, and capacitors and can be described as a combination of transfer functions that result in a transfer function H(s) 38. The ADC 70 of FIG. 6 can include an N-bit quantizer (QTZ) circuit 56, e.g., where 1≤N≤5, configured to receive an output C(t) of the loop filter circuit 36. In some examples, the N-bit quantizer circuit 56 can be implemented as a FLASH ADC due to the low number of bits required. The quantizer circuit 56 can generate a digital output D1 sampled by a clock signal at frequency fs.

The ADC 70 of FIG. 6 can include a digital-to-analog converter (DAC) circuit 42 connected to an output of the quantizer circuit 56 and connected in feedback. The output B(t) of the DAC circuit 42 can be subtracted from the analog input signal A(t) to generate the signal E(t), as conceptually depicted by a subtractor circuit 44. In this manner, the loop filter circuit 36 can include an input 58 configured to receive a difference between a first representation A(t) of an input signal 15 (received by the antenna 12 of FIG. 4) and a feedback signal B(t).

The quantizer circuit 56 can include one or more inputs 60A, 60B configured to receive an output C(t) of the loop filter circuit 36 and configured to receive a second representation of the input signal 15 (received by the antenna 12 of FIG. 4) that bypasses the loop filter circuit 36. In the example shown in FIG. 6, the input of the ADC 70 can be coupled to the one or more inputs of the quantizer circuit 56 such that the first representation A(t) of the input signal 15 (received by the antenna 12 of FIG. 4) and the second representation A(t) of the input signal 15 are the same representation of the input signal 15.

In some configurations, the quantizer circuit 56 can include two inputs 60A, 60B. For example, the input 60A of the quantizer circuit 56 can be configured to receive an output C(t) of the loop filter circuit 36 and the second input 60B can be configured to receive the second representation A'(t) of the input signal 15 (received by the antenna 12 of FIG. 4) that bypasses the loop filter circuit 36.

In other configurations, the quantizer circuit 56 can include one input, e.g., input 60A, that can receive both signals C(t) and A(t) in a time-interleaved manner.

The quantizer circuit 56 can include two outputs, namely an AGC control output 62 and a quantizer signal output 64. The AGC control output 62, coupled to an input of an automatic gain control (AGC) circuit 32, can output signal D2 directly to the AGC circuit 32 to establish a gain parameter using a quantization of the representation A(t) of the input signal 15 (received by the antenna 12 of FIG. 4) that bypasses the loop filter circuit 36.

The quantizer signal output 64, coupled to an input of a decimation circuit 28, can output signal D1 to provide a quantized signal using a quantization of the difference between a representation A(t) of an input signal 15 (received by the antenna 12 of FIG. 4) and the feedback signal B(t) from the DAC circuit 42. The DAC circuit 42 can be configured to receive the quantizer signal output D1 and provide the feedback signal B(t) to the loop filter circuit 36.

In the ADC architecture shown in FIG. 6, e.g., a CT ΔΣ-ADC, the additional input A(t) can be converted directly by the N-bit quantizer circuit 56 to generate an N-bit output D2 during CLK_bar, as illustrated in the quantizer circuit timing diagram of FIG. 7.

FIG. 7 depicts another example timing diagram for an N-bit FLASH based quantizer with input clock signal CLK sampled at frequency fs=1/Ts using various techniques of this disclosure described above with respect to FIGS. 4-6. Similar to the quantizer timing diagram in FIG. 3, during CLK=1 and after the comparator latch reset signal R is released, the quantizer decision signal Q generates an N-bit representation of the active quantizer input signal C(t). The quantizer decision signal Q can then be clocked into a memory device, such as a DFF, to generate the latched output D1 on the falling edge of CLK. In other words, outputs D1 and D2 are latched versions of signal Q.

After the falling edge of CLK, the input A'(t) becomes the active input to the quantizer circuit 56 and a reset pulse R of sufficient duration denoted by time Tr, needed to reset the quantizer latch and restore any internal nodes, can be generated. Then, during CLK=0 and after the comparator latch reset signal R is released, the signal Q evaluates the N-bit representation of the active quantizer input signal A'(t). Q can then be clocked into another memory device, such as a DFF, to generate digital output D2 on the rising edge of CLK.

After the rising edge of CLK, the quantizer is reset during R==1, and after the falling edge of R, when CLK=1, the quantizer converts signal C(t). After the falling edge of CLK, the quantizer is reset during R=1, and, after the falling edge of R, when CLK=0, the quantizer converts A'(t). Output D2 is captured by the latch on the rise time of CLK, and output D1 is captured by the latch on the fall time of CLK, ping-ponging between C(t) and A'(t).

Using this method, the internal ΔΣ quantizer circuit 56 can generate during the same period Ts as in FIG. 3 both the oversampled N-bit signal D1 necessary for ΔΣ loop operation as well as the N-bit signal D2 without any additional hardware requirements beyond an extra DFF to store the value of D2. The new output signal D2 can be an N-bit low-latency direct conversion of the ADC input signal A'(t) and as such it can be made directly available to the digital AGC circuit 32 of FIG. 4 without any need for digital decimation or filtering.

The additional input A'(t) can also be dynamically switched to any point along the baseband signal chain on different periods of frequency fs. As a result, the output D2 can be used to provide time-interleaved information about signal levels at multiple points along the signal chain.

Figure 8:
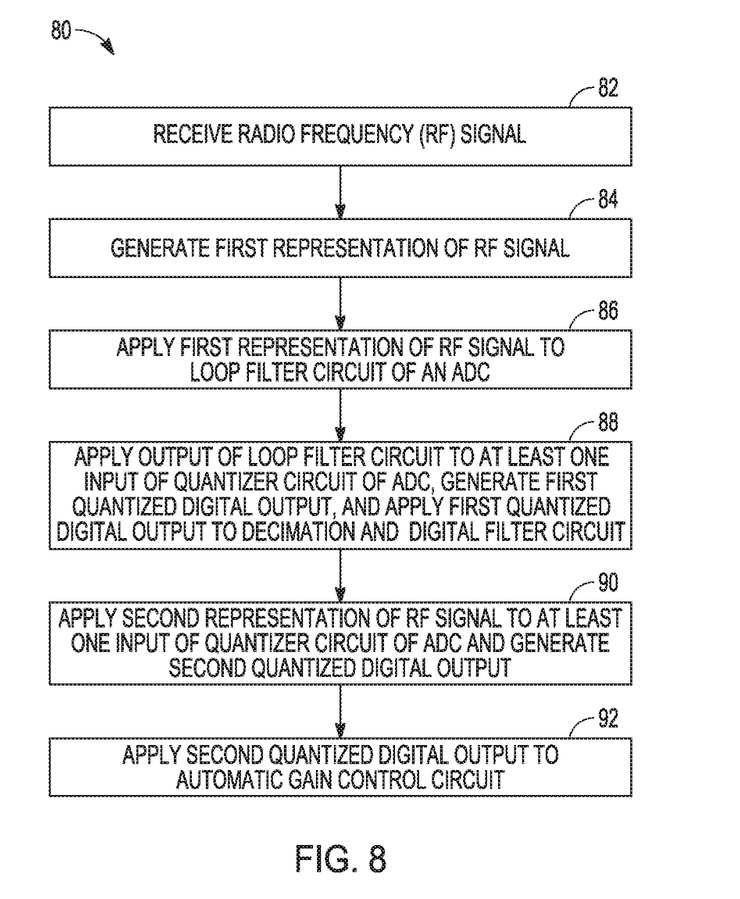
FIG. 8 is a flow diagram depicting an example method of reducing latency in an ADC, using various techniques of this disclosure.

FIG. 8 is a flow diagram depicting an example method 80 of reducing latency in an ADC of a radio receiver, using various techniques of this disclosure. At block 82, a receiver circuit, e.g., receiver circuit 50 of FIG. 4, can receive a radiofrequency (RF) signal, e.g., via an antenna 12 of FIG. 4. At block 84, the receiver circuit can generate a first representation of the RF signal, e.g., using one or more of the LNA circuit 14, the BBF circuits 24A, 24B and the PGA circuits 24A, 24B of FIG. 4.

At block 86, the receiver circuit can apply the first representation of the RF signal to a loop filter circuit of an analog-to-digital circuit (ADC), e.g., the loop filter circuit 36 of ADCs 54, 70 of FIGS. 5 and 6. At block 88, the receiver circuit can apply an output of the loop filter circuit to at least one input of a quantizer circuit, e.g., the quantizer circuit 56 of ADCs 54, 70 of FIGS. 5 and 6, generate a first quantized digital output, e.g., quantized digital output D1 of FIGS. 5 and 6, and apply the first quantized digital output to a decimation and digital filter circuit, e.g., the decimation and digital filter circuit 28 of FIG. 4.

At block 90, the receiver circuit can apply a second representation of the RF signal, e.g., the additional input A'(t) of FIG. 5 or input A(t) of FIG. 6, to one or more inputs of the quantizer circuit of the ADC and generate a second quantized digital output. For example, the receiver circuit can apply the additional input A'(t) of FIG. 5 or input A(t) of FIG. 6 to one or more inputs of the quantizer circuit 56 of FIG. 5 or 6 and generate a second quantized digital output D2. At block 92, the receiver circuit can apply the second quantized digital output D2 to an automatic gain control circuit, e.g., the AGC circuit 32 of FIG. 4.

As described above, various receiver architectures of this disclosure can reduce the latency and complexity associated with an ADC, e.g., CT ΔΣ-ADC, for AGC adjustment in a receiver signal chain. A dual-input ADC structure can be implemented that can generate an additional output D2. This low latency output D2 can be made directly available to the AGC circuit 32 without any significant additional hardware requirements. The additional input, e.g., input A'(t) of FIG. 5, can convert any signal along the baseband receiver signal chain into an N-bit Nyquist rate digital output. The additional input A'(t) can also be setup to convert a variety of signals in a time-interleaved fashion to provide dynamic information regarding signal levels along the analog receiver baseband.

The proposed dual-input ADC and receiver architectures can reduce the latency associated with AGC solutions as well as increase the flexibility of such solutions with minimal additional hardware. This can improve the throughput, reliability and stability of packet-based point-to-point protocols typical in area and power constrained IoT applications.

Various Notes

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "aspects" or "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

What is claimed is:

1. An analog-to-digital converter (ADC) circuit comprising:
   a loop filter circuit including a first input configured to receive a first representation of an input signal and a second input configured to receive a feedback signal;
   a quantizer circuit including:
      at least one input configured to receive an output of the loop filter circuit and configured to receive a second representation of the input signal that bypasses the loop filter circuit;
      an AGC control output, coupled to an input of an automatic gain control (AGC) circuit to establish a gain parameter using a quantization of the second representation of the input signal that bypasses the loop filter circuit; and
      a quantizer signal output, coupled to an input of a decimation circuit to provide a quantized signal using a quantization of a difference between the first representation of an input signal and the feedback signal; and
   a digital to analog converter (DAC) circuit configured to receive the quantizer signal output and provide the feedback signal to the second input of the loop filter circuit.

2. The ADC circuit of claim 1, wherein the input of the ADC is coupled to the at least one input of the quantizer circuit such that the first representation of the input signal and the second representation of the input signal are the same representation of the input signal.

3. The ADC circuit of claim 1, wherein the input of the loop filter circuit is configured to receive an output one of a baseband filter and a programmable gain amplifier circuit, and wherein the at least one input of the quantizer circuit is coupled to one of the output of the baseband filter and an internal node of the baseband filter.

4. The ADC circuit of claim 1, wherein the input of the loop filter circuit is configured to receive an output one of a baseband filter and a programmable gain amplifier circuit, and wherein the at least one input of the quantizer circuit is configured to receive an output of a mixer circuit.

5. The ADC circuit of claim 1, wherein the input of the AGC circuit is a first input, and wherein the decimation circuit includes an output coupled to a second input of the AGC circuit.

6. The ADC circuit of claim 1, wherein the ADC includes a continuous-time delta-sigma ADC.

7. The ADC circuit of claim 1, wherein the at least one first input of the quantizer circuit includes a first input and a second input, and wherein the first input is configured to receive an output of the loop filter circuit and the second input is configured to receive the second representation of the input signal that bypasses the loop filter circuit.

8. A radiofrequency (RF) receiver circuit to couple to an antenna to receive an RF input signal, the RF receiver circuit comprising:
   an analog-to-digital converter (ADC) circuit coupled to an output of one of a baseband filter circuit and a programmable gain amplifier circuit, the ADC circuit including:

a loop filter circuit including a first input configured to receive a feedback signal and a second input configured to receive the output of one of the baseband filter circuit and the programmable gain amplifier circuit;

a quantizer circuit including:
  at least one input configured to receive an output of the loop filter circuit and configured to receive a representation of the input signal that bypasses the loop filter circuit;
  an AGC control output, coupled to an input of an automatic gain control (AGC) circuit to establish a gain parameter using a quantization of the representation of the input signal that bypasses the loop filter circuit; and
  a quantizer signal output, coupled to an input of a decimation circuit to provide a quantized signal using a quantization of a difference between the representation of the RF input signal and the feedback signal;

a digital to analog converter (DAC) circuit configured to receive the quantizer signal output and provide the feedback signal to the first input of the loop filter circuit.

9. The RF receiver circuit of claim 8, wherein the first input of the loop filter circuit is coupled to the at least one input of the quantizer circuit.

10. The RF receiver circuit of claim 8, wherein the at least one input of the quantizer circuit is coupled to one of the output of the baseband filter, the output of the programmable gain amplifier circuit, and an internal node of the baseband filter.

11. The RF receiver circuit of claim 8, wherein the at least one input of the quantizer circuit is configured to receive the output of a mixer circuit.

12. The RF receiver circuit of claim 8, wherein the input of the AGC circuit is a first input, and wherein the decimation circuit includes an output coupled to a second input of the AGC circuit.

13. The RF receiver circuit of claim 8, further comprising:
  a mixer circuit, wherein the mixer circuit includes an I/Q mixer circuit, wherein the output of the mixer circuit includes a first output and a second output, wherein the first output provides an in-phase (I) signal path, wherein the second output provides a quadrature-phase (Q) signal path, and wherein the receiver includes respective I/Q channels.

14. The RF receiver circuit of claim 8, wherein the at least one first input of the quantizer circuit includes a first input and a second input, and wherein the first input is configured to receive an output of the loop filter circuit and the second input is configured to receive the representation of the input signal that bypasses the loop filter circuit.

15. The RF receiver circuit of claim 8, wherein the ADC includes a continuous-time delta-sigma ADC.

16. A method for radio receiver gain control, the method comprising:
  receiving a radiofrequency (RF) signal;
  generating a first representation of the RF signal;
  applying the first representation of the RF signal to a first input of a loop filter circuit of an analog-to-digital circuit (ADC);
  applying an output of the loop filter circuit to at least one input of a quantizer circuit of the ADC, generating a first quantized digital output, and applying the first quantized digital output to a decimation and digital filter circuit;
  applying a second representation of the RF signal to the at least one input of the quantizer circuit of the ADC and generating a second quantized digital output; and
  applying the second quantized digital output to an automatic gain control circuit.

17. The method of claim 16, wherein applying a second representation of the RF signal to the at least one input of the quantizer of the ADC and generating a second quantized digital output includes:
  applying one of the output of the baseband filter and an internal node of the baseband filter to the at least one input of the quantizer of the ADC and generating a second quantized digital output.

18. The method of claim 16, wherein applying a second representation of the RF signal to the at least one input of the quantizer of the ADC and generating a second quantized digital output includes:
  applying an output of a mixer circuit to the at least one input of the quantizer of the ADC and generating a second quantized digital output.

19. The method of claim 16, wherein applying a second representation of the RF signal to the at least one input of the quantizer of the ADC and generating a second quantized digital output includes:
  applying an output of a programmable gain amplifier circuit to the at least one input of the quantizer of the ADC and generating a second quantized digital output.

20. The method of claim 16, wherein the first representation of the RF signal applied to the loop filter and the second representation of the RF signal are the same representation of the RF signal.

21. The RF receiver circuit of claim 8, further comprising:
  a low noise amplifier (LNA) circuit including an input coupled to the antenna and an output.

22. The RF receiver circuit of claim 8, further comprising:
  a mixer circuit including a first input configured to receive the output of a low noise amplifier (LNA) circuit, a second input configured to receive a local oscillator signal, and an output, the mixer circuit configured to mix the output of the LNA circuit received at the first input with the local oscillator signal received at the second input to provide an intermediate frequency signal at a lower frequency than the received RF signal at the output.

23. The RF receiver circuit of claim 8, further comprising:
  the baseband filter circuit including an input configured to receive the output of a mixer circuit; and
  an automatic gain control (AGC) circuit including an input and at least one output coupled to and configured to establish a gain parameter of at least one of a low noise amplifier (LNA) circuit, the mixer circuit, and the baseband filter circuit.

* * * * *